(12) United States Patent
Arai et al.

(10) Patent No.: US 7,226,332 B2
(45) Date of Patent: Jun. 5, 2007

(54) LIGHT EMITTING DEVICE AND MANUFACTURING METHOD THEREOF

(75) Inventors: Yasuyuki Arai, Kanagawa (JP); Tomoyuki Iwabuchi, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 178 days.

(21) Appl. No.: 10/424,659

(22) Filed: Apr. 28, 2003

(65) Prior Publication Data

US 2004/0160167 A1    Aug. 19, 2004

(30) Foreign Application Priority Data

Apr. 30, 2002    (JP) ............................. 2002-129408

(51) Int. Cl.
  *H01L 51/00*    (2006.01)
  *H01L 9/00*    (2006.01)
  *H05B 33/10*    (2006.01)

(52) U.S. Cl. ..................... 445/24; 313/506; 313/504; 257/40

(58) Field of Classification Search ............... 313/504, 313/506, 500; 445/24; 257/40
See application file for complete search history.

(56) References Cited

U.S. PATENT DOCUMENTS

| 5,684,365 | A | 11/1997 | Tang et al. | ............. 315/169.3 |
|---|---|---|---|---|
| 6,365,825 | B1 | 4/2002 | Hayashi et al. | ............. 136/290 |
| 6,380,689 | B1 | 4/2002 | Okuda | ..................... 315/169.3 |
| 6,727,645 | B2* | 4/2004 | Tsujimura et al. | ......... 313/504 |
| 6,777,249 | B2* | 8/2004 | Yamazaki | ...................... 438/4 |
| 6,876,007 | B2* | 4/2005 | Yamazaki et al. | ............ 257/88 |
| 2002/0042152 | A1 | 4/2002 | Yamazaki et al. | ............ 438/4 |
| 2004/0099305 | A1* | 5/2004 | Heller | ........................ 136/263 |

FOREIGN PATENT DOCUMENTS

| JP | 2002-109432 | 4/1991 |
|---|---|---|
| JP | 8-234683 | 9/1996 |
| JP | 2001-109432 | 4/2001 |
| JP | 2001-230082 | 8/2001 |

* cited by examiner

*Primary Examiner*—Karabi Guharay
(74) *Attorney, Agent, or Firm*—Cook, Alex, McFarron, Manzo, Cummings & Mehler, Ltd.

(57) ABSTRACT

The present invention is intended to stabilize a luminance and prevent a degradation during use in a display device of an active matrix driving system that arranges TFTs in matrix, by completely repairing a defective portion through application of a reverse voltage and repairing a short-circuit or leak area of a light emitting device. A light emitting device with a pixel structure of an active matrix driving system having TFTs arranged at each pixel has a feature that a reverse voltage is applied to the light emitting element without passing through the TFT is disclosed. The present invention provides a pixel structure capable of attaining the feature and a method of manufacturing the same.

14 Claims, 11 Drawing Sheets

INITIAL (FIRST TIME)

SECOND TIME

LIGHT EMITTING DEVICE AND MANUFACTURING METHOD THEREOF

BACKGROUND OF THE INVENTION

1. Field of the Invention

The present invention relates to a light emitting device that includes a light emitting element containing a luminous body in a single layer or a laminate of plural layers between a pair of electrodes, and a method of manufacturing the same. In particular, the present invention relates to a technique in which a short-circuit or leak area developing in a step of manufacturing the light emitting element can be repaired with a simplified method.

2. Description of Related Art

As an example of a light emitting element formed using a light emitting medium called an organic electroluminescent material, there is a structure in which an organic amine-based hole transport layer and a layer containing an organic compound such as a tris-(8-quinolinolato) aluminum complex ($Alq_3$) that exhibits an electron conduction property and also has a luminescent property, are laminated between a pair of electrodes. The light emitting element can obtain a luminance of several hundred $cd/cm^2$ through application of DC voltage at 6 to 8V.

In the light emitting element, when layers responsible for emitting light directly or indirectly are functionally represented, distinction may be made among layers, like a light emitting layer, a hole injection layer, an electron injection layer, a hole transport layer, an electron transport layer, and the like. These functional representations occasionally enable distinguishment clearly on the layer basis, but cannot lead to clear distinguishment on the layer basis because a layer formed as a part of a mixed structure in some cases. An extremely simple structure has an anode/a light emitting layer/and a cathode, which are laminated in this order. In addition to this structure, there are other structures having an anode/a hole injection layer/a light emitting layer/and a cathode, and having an anode/a hole injection layer/a light emitting layer/an electron transport layer/and a cathode, laminated in the stated orders.

A light emitting element operating normally shows a rectification property in which a so-called current-voltage characteristic as a diode has is observed. That is, when applying a forward bias to the light emitting element, a current increases exponentially in response to the applied voltage. When applying a reverse bias, a current hardly flows until the voltage reaches a breakdown voltage. In order to cause the element to emit light, charge is necessarily injected, and therefore a forward bias is applied.

JP 8-234683 A discloses an example of a light emitting device having an active matrix driving system that controls the above-mentioned light emitting element with a field effect transistor. According to JP 8-234683 A, a structure is disclosed in which an organic electroluminescent layer is formed as an upper layer on a thin film transistor (TFT) made from polycrystalline silicon via an insulating film formed of silicon dioxide. Further, a passivation layer having an end processed into a tapered shape on an anode, is positioned on a lower layer side of the organic electroluminescent layer. Furthermore, a material having a work function of less than 4 eV is selected to form a cathode. An alloy of metal such as Ag or Al and Mg may be adapted.

Incidentally, when a reverse voltage, which is not involved in emitting light, is applied to the light emitting element, it is empirically known that a life of the element extends. JP 2001-109432 A discloses a light emitting device of an active matrix driving system that utilizes this phenomenon and applies a reverse voltage in a non-light emitting period according to synchronous timings of input video image data.

Meanwhile, as to a solar cell or the like that forms diodes with semiconductor thin films, various techniques are experimented for repairing a short-circuit portion by applying a reverse voltage. An example of the technique is disclosed in U.S. Pat. No. 6,365,825 B in which a current concentratedly flows on a short-circuit portion by the reverse voltage application, and a short-circuit defect is repaired by insulating the portion with use of heat generated due to Joule heat.

FIG. 9(A) schematically shows a light emitting element that includes short-circuit defects caused by a pinhole 14 and a foreign matter 15 mixing therein, and is a drawing useful in explaining the reverse voltage effect. When there is a short-circuit defective portion 14 in a diode element 10 including a thin film 12 that enables a rectifying contact or a rectifying junction between a pair of electrodes composed of a anode 11 and a cathode 13, a current equal to or higher than a reverse saturation current flows via the portion upon application of a reverse voltage.

As schematically shown in FIG. 9(B) using points A and B indicated by the dotted lines at the time of applying the reverse voltage, a current-voltage characteristic of the diode element 10, the reverse current rapidly increases at a certain voltage. For example, at the short-circuit defect caused by the short-circuit defective portion 14 including the pinhole, the reverse current flows at a relatively low voltage because a cathode material wraps around the portion. Further, when the minute foreign matter 15 is included in the element, a withstand voltage becomes lower, forming the short-circuit defective portion 15 where the reverse current increases at a breakdown voltage or lower due to dielectric breakdown.

At this time, the current concentratedly flows on the short-circuit defective portions 14 and 15, and a current density increases. Heat is thus generated to reach a high temperature, whereby the portion is modified to be insulated. Therefore, from the second voltage scanning operation onward, a normal diode characteristic can be obtained. Even if the short-circuit defective portion is not repaired by scanning a voltage once, when the voltage scanning is repeated plural times, a probability of repairing the defective portion increases. In this way, the short-circuit portion is insulated to be repaired by the application of a predetermined reverse voltage.

The repairing of the short-circuit portion through the application of a reverse voltage can be conducted relatively easily. However, a principle of the repairing is to utilize a heat generation phenomenon caused by the current concentration. It is thus necessary to make a large current flow instantly. Therefore, a constant voltage source having a current supply capacity suitable for the flow of large current is required for a power source to be applied.

However, as to a drain current of a TFT used in an active matrix driving system, when a gate voltage is determined as shown in FIG. 10, a flowing current almost saturates no matter how the drain voltage is increased. That is, as long as the operation is executed in a saturation region of the TFT, this is equivalent to a case where the connection is made to the constant current source. Also, even when the operation is executed in a linear region, this leads to the same result, in other words, a current equal to or higher than the saturation current is not allowed to flow. Even when a reverse voltage is applied via the TFT, a limitation is placed on a maximum current value. Therefore, such a short-circuit defect shown in FIG. 9 cannot be insulated sufficiently.

The present invention has been made with a view toward solving the above-mentioned problems, and it is therefore an object to stabilize a luminance and prevent a degradation during use in a display device of the active matrix driving system that arranges TFTs in matrix, by completely repairing the defective portion through the application of a reverse voltage and repairing the short-circuit or leak area of the light emitting element.

SUMMARY OF THE INVENTION

To solve the above-mentioned problems, the present invention relates to a light emitting device with a pixel structure of the active matrix driving system having the TFTs arranged at each pixel, which is characterized in that a reverse voltage is applied to the light emitting element without passing through the TFT. The present invention provides a pixel structure capable of attaining the feature and a method of manufacturing the pixel structure.

A method of manufacturing a light emitting device according to the present invention includes: forming a first electrode that is connected to a TFT and a second electrode that extends in a strip shape on a same insulating surface; forming on the second electrode, a single layer or a laminate of plural layers that contains a luminous body and a third electrode of the light emitting element, the third electrode crossing the second electrode via the single layer or the laminate; applying a voltage to the second electrode and the third electrode to repair a short-circuit defective portion; and separating the third electrode into individual third electrodes connected to the first electrode. In this manufacturing method, the first electrode and the second electrode may be formed of a same material, and it is allowed to form an opening above the first electrode and the second electrode, form a barrier layer that covers an end of the opening, and form the third electrode so as to extend over the barrier layer.

With the application of a voltage between the second electrode extending in a strip shape and the third electrode formed on the single layer or the laminate of plural layers that contains the luminous body and crossing the second electrode, the defective portion is completely repaired through application of a reverse voltage without passing through the TFT, so that the short-circuit or leak area of the light emitting element can be repaired. The second electrode and the third electrode are formed on an interlayer insulating film constituting an upper layer of the TFT so as to cross each other. Thus, it is possible to freely apply a reverse voltage between the two electrodes. After that, the third electrode may be separated by etching into individual electrodes.

In addition, a method of manufacturing a light emitting device according to the present invention includes: forming an individual pixel electrode connected to a TFT; forming on the individual pixel electrode, a single layer or a laminate of plural layers that contains a luminous body and a first common electrode and a second common electrode, the first and second common electrodes overlapping the individual pixel electrode via the single layer or the laminate and being separated from each other; and applying a voltage between the first common electrode and the second common electrode to repair a short-circuit defective portion.

By arranging the first common electrode and the second common electrode in parallel on the single layer or the laminate of plural layers that contains the luminous body and applying a voltage between the two electrodes, the defective portion is completely repaired through application of a reverse voltage without passing through the TFT, so that the short-circuit or leak area of the light emitting element can be repaired.

For the application of a reverse voltage, a method of repairing a short-circuit defective portion by applying a pulsed voltage can be applied. It is also possible to repair the short-circuit defective portion by applying a pulsed voltage that rises and drops stepwise.

A light emitting device of the present invention includes a light emitting element formed in such a manner that: a first electrode that is connected to a TFT is arranged in matrix; the first electrode and a second electrode that extends in a strip shape are formed on a same insulating surface; and a single layer or a laminate of plural layers that contains a luminous body and a third electrode are formed on the second electrode, the third electrode overlapping the second electrode via the single layer or the laminate and being connected to the first electrode. In this structure of the present invention, a structure may be such that: a barrier layer having an opening above the first electrode and the second electrode is formed; and a single layer or a laminate of plural layers that contains a luminous body and a third electrode are provided on the second electrode, the third electrode overlapping the second electrode via the single layer or the laminate and extending over the barrier layer.

In this structure of the present invention, by employing a structure in which the third electrode formed on the single layer or the laminate of plural layers that contains the luminous body is connected to the first electrode, a reverse voltage can be applied without passing through the TFT, and the defective portion is thus completely repaired, so that the short-circuit or leak area of the light emitting element can be repaired.

A light emitting device of the present invention has such a structure that: an individual pixel electrode connected to a TFT are arranged in matrix; the individual pixel electrode is formed on an insulating surface; a single layer or a laminate of plural layers that contains a luminous body and a first common electrode and a second common electrode are placed on the individual pixel electrode, the first and second common electrodes overlapping the individual pixel electrode via the single layer or the laminate and extending without crossing each other; and the first common electrode and the second common electrode are applied with a same potential in a light emitting period and applied with different potentials in a non-light emitting period. In this structure of the present invention, a structure may be such that: a barrier layer having an opening above the individual pixel electrode is formed; and a single layer or a laminate of plural layers that contains a luminous body and a first common electrode and a second common electrode are placed on the individual pixel electrode, the first and second common electrodes overlapping the individual pixel electrode via the single layer or the laminate and extending over the barrier layer while the electrodes do not cross each other. The first common electrode and the second common electrode can be applied with voltages having different polarities easily by way of connection to different power sources.

With this structure of the present invention, by arranging the first common electrode and the second common electrode in parallel on the single layer or the laminate of plural layers that contains the luminous body and applying a voltage between the two electrodes, the defective portion is completely repaired through application of a reverse voltage without passing through the TFT, so that the short-circuit or leak area of the light emitting element can be repaired.

BRIEF DESCRIPTION OF THE DRAWINGS

FIGS. 13(A)–12(B) are equivalent circuits useful in explaining a principle on which a light emitting element is repaired by a reverse voltage according to Embodiment Mode 2.

DETAILED DESCRIPTION OF THE INVENTION

Figure 1:
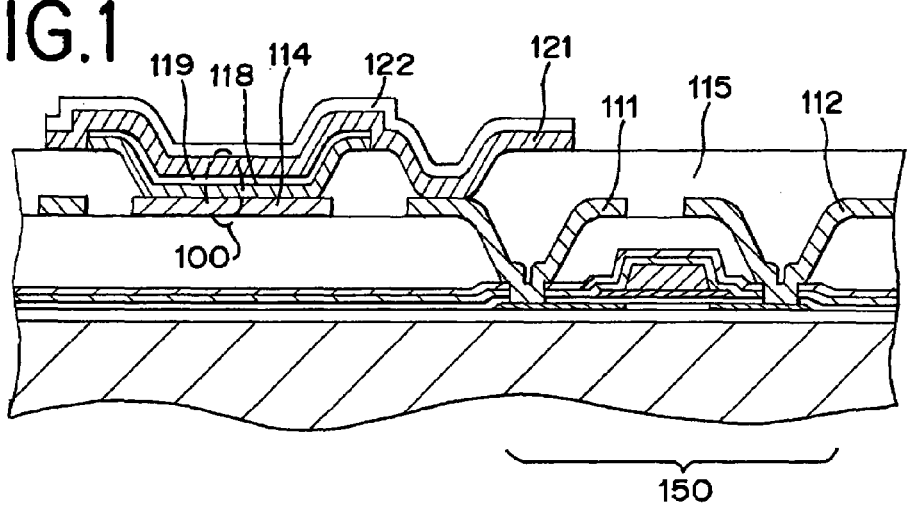
FIG. 1 is a vertical sectional view useful in explaining a structure of a pixel according to Embodiment Mode 1.

Hereinafter, embodiment modes of the present invention are described in detail while referring to the drawings.

Embodiment Mode 1

In this embodiment mode, a light emitting device is described in which: a first electrode that is connected to a TFT and a second electrode of a light emitting element that extends in a strip shape are formed on a same insulating surface; a coating made of a light emitting medium is formed on the second electrode; a third electrode of the light emitting element is formed on the coating so as to extend while crossing the second electrode; a reverse voltage application treatment for repairing a short-circuit defective portion is performed; and the third electrode is separated into individual electrodes. In the light emitting device of this embodiment mode, it is possible to repair a short-circuit defective portion by applying a voltage to the second electrode and the third electrode. The short-circuit defective portion can be repaired by applying a pulsed voltage or a pulsed voltage that rises and drops stepwise.

Figure 2A:
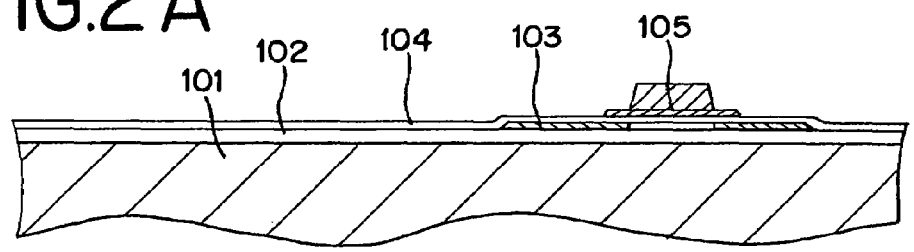
FIGS. 2(A)–2(C) are vertical sectional views useful in explaining steps of manufacturing the pixel according to Embodiment Mode 1.

First, as shown in FIG. 2(A), a semiconductor film 103 that forms an impurity region constituting a channel formation region, source/drain regions, and the like of TFT is formed on a first insulating film 102 that is formed on a substrate 101. An insulating substrate such as a glass substrate or a quartz substrate is applied for the substrate 101. The first insulating film 102 is formed with a coating film of silicon nitride, silicon oxide, silicon nitride oxide, or the like, or a laminate thereof to have a thickness of 50 to 200 nm. A coating film that has a function of blocking an impurity from the substrate 101 is used for the first insulating film 102. A crystalline silicon film prepared by crystallizing by use of heat or light energy an amorphous silicon film with a thickness of 30 to 150 nm formed through deposition by a plasma CVD method and a reduced pressure CVD method, is preferably used for the semiconductor film 103. A silicon nitride oxide film made by mixing silicon oxide, which is formed with TEOS through the plasma CVD method, $SiH_4$, and $N_2O$, with a thickness of 50 to 150 nm is used for a second insulating film 104. It is also possible to form the second insulating film 104 by using an insulating film that contains aluminum nitride oxide ($AlO_xN_{1-x}$: x=0.01 to 20 atom %), aluminum nitride, silicon nitride, or the like, as another material. A gate electrode 105 contains at least one of metal materials including Al, W, Ta, Ti, Mo, etc., and may have in section a rectangular shape, a tapered shape, or a variant shape in which its bottom portion protrudes toward outside more than its upper portion to have a convex shape. In this case, improvement in contactability and facilitation in selective processing may be achieved by forming metal nitride on the second insulating film 104 side.

Figure 4:
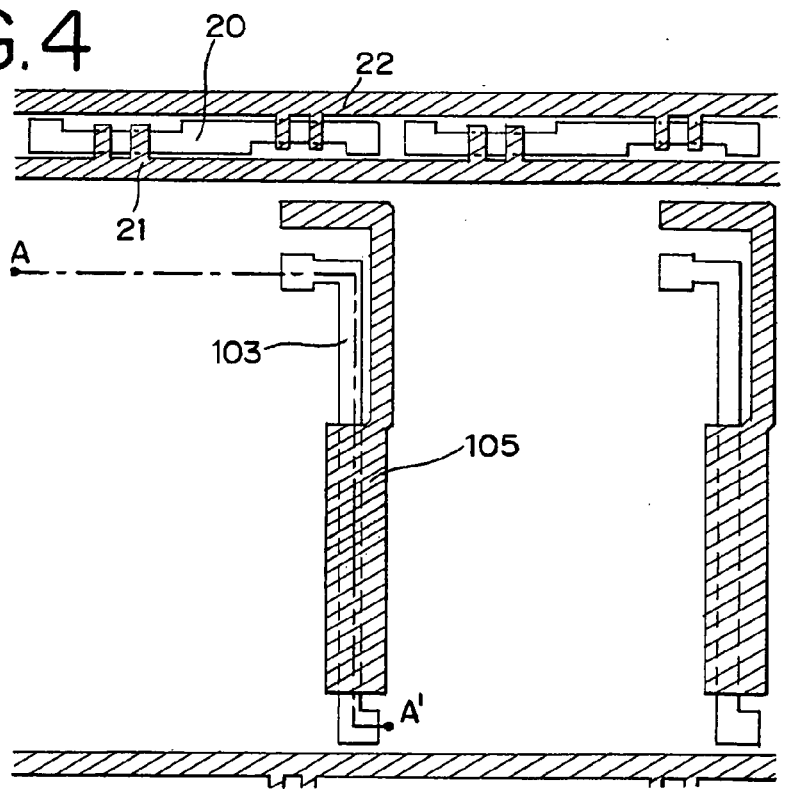
FIG. 4 is a top view useful in explaining a step of manufacturing the pixel according to Embodiment Mode 1.

FIG. 4 is a top view of this state, and a vertical section view corresponding to a line of A–A' is shown in FIG. 2(A). In the top view shown in FIG. 4, a second semiconductor film 20, a scan signal line 21 doubling as a gate electrode, and an erase signal line 22 are similarly formed.

Figure 2B:
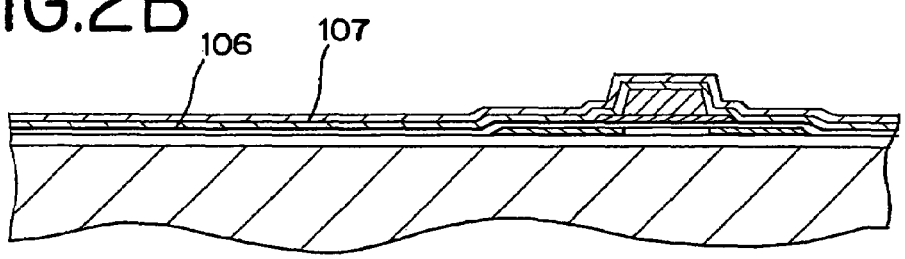

Next, in FIG. 2(B), a third insulating film 106 is formed so as to contain silicon nitride and have a thickness of 50 to 200 nm. A fourth insulating film 107 is formed of a silicon oxide or silicon nitride oxide film with a thickness of 50 to 100 nm. It is sufficient to supply hydrogen contained in the third insulating film 106 for hydrogenation of the semiconductor film. The hydrogenation can be performed with heating treatment at 400 to 450° C.

Figure 2C:
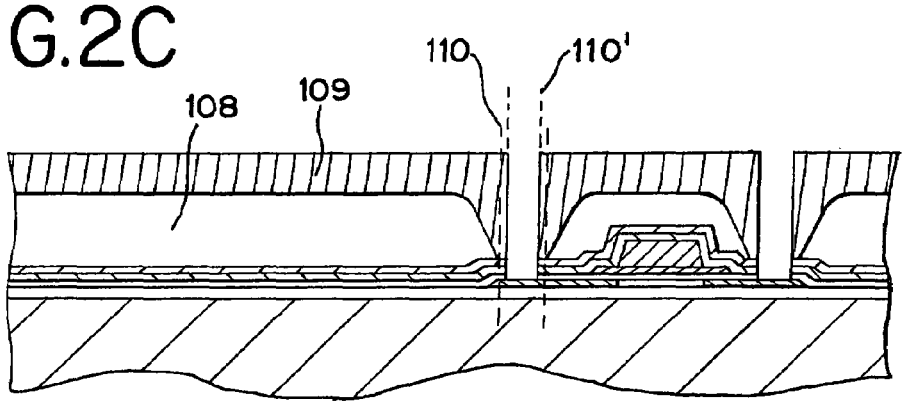

In FIG. 2(C), a fifth insulating film 108 is further formed. The fifth insulating film 108 is formed of an organic compound such as photosensitive acrylic or photosensitive polyimide. A thickness of the film is set to about 0.5 to 2 μm to reduce a capacitance between wirings. With use of a photosensitive material, an opening 110 can be formed simultaneously upon the formation of the fifth insulating film 108. In a case where a photosensitive material is used, because each sidewall is allowed to be slanted, an upper end and a lower end of the opening 110 are formed with curvature. Therefore, when depositing a wiring material, it can be formed with a satisfactory coverage. After that, a resist mask 109 that forms an opening 110' inside the opening 110 is provided to be used as a mask when etching treatment is performed. Thus, a contact hole is formed in the second insulating film 104, the third insulating film 106, and the fourth insulating film 107.

Figure 3A:
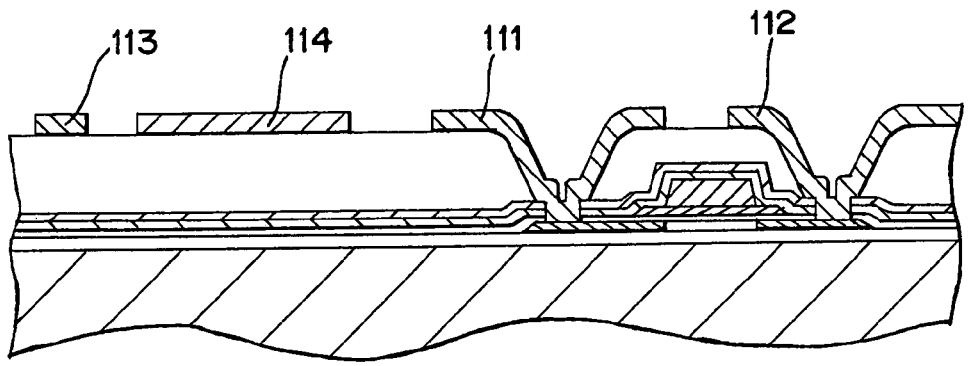
FIGS. 3(A)–3(C) are vertical sectional views useful in explaining steps of manufacturing the pixel according to Embodiment Mode 1.

As shown in FIG. 3(A), a first electrode 111 connected to a TFT, a wiring 112 (power source line), and a wiring 113 (data signal line) are formed so as to contain at least one of metal materials including Al, W, Ta, Ti, Mo, etc. These wirings each have a laminate structure composed of Ti and Al in which Ti is in contact with the semiconductor film to improve heat resistance. In a pixel region, a second electrode 114 extending in a strip shape may be formed of the same material as the first electrode 111. Alternatively, a material high or low in a work function may be selected for forming the electrode in consideration of hole injection property or electron injection property with respect to the light emitting element.

In a case where the second electrode 114 is set as an anode of the light emitting element, a material having a work function of 4 eV or higher is selected, that is, ITO (Indium Tin Oxide: indium oxide to which tin oxide is mixed), zinc oxide, IZO (Indium Zinc Oxide: indium oxide to which zinc oxide is mixed), titanium nitride, tungsten nitride, or the like is used. On the other hand, when the second electrode 114 is set as a cathode, a material having a work function of 4 eV or lower is selected. That is, alkali metal or alkali earth metal, or an alloy or compound including the above metal, for example, AlLi, MgAg, LiF, CaF, or CsF, is used.

Figure 5:
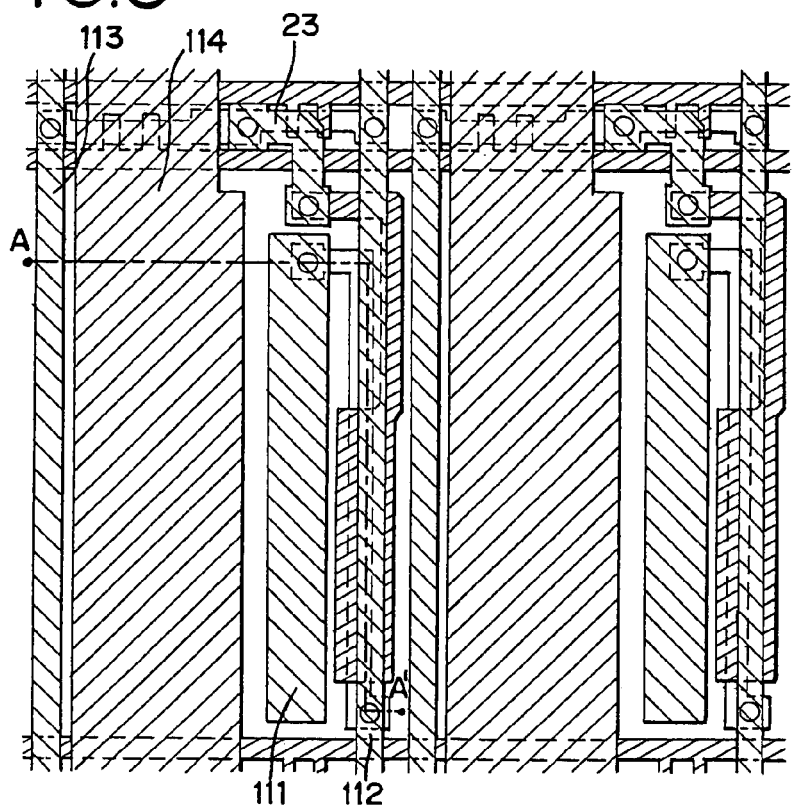
FIG. 5 is a top view useful in explaining a step of manufacturing the pixel according to Embodiment Mode 1.

FIG. 5 is a top view of this state, and a vertical section view corresponding to a line of A–A' is shown in FIG. 3(A). In FIG. 5, reference numeral 23 denotes a wiring connected to a TFT in a pixel, which is formed simultaneously upon the formation of the wiring 112 and the like.

Figure 3B:
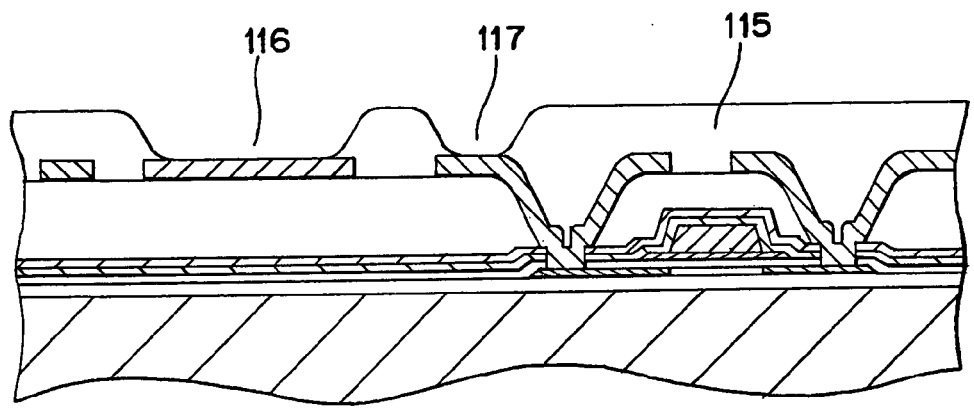

As shown in FIG. 3(B), a sixth insulating layer 115 is formed so as to have an opening 117 above the first electrode 111 and an opening 116 above the second electrode 114, and to cover an end thereof. By using a photosensitive material, each side wall portion is allowed to be slanted, and thus the opening with continuous curvature can be formed.

Figure 3C:
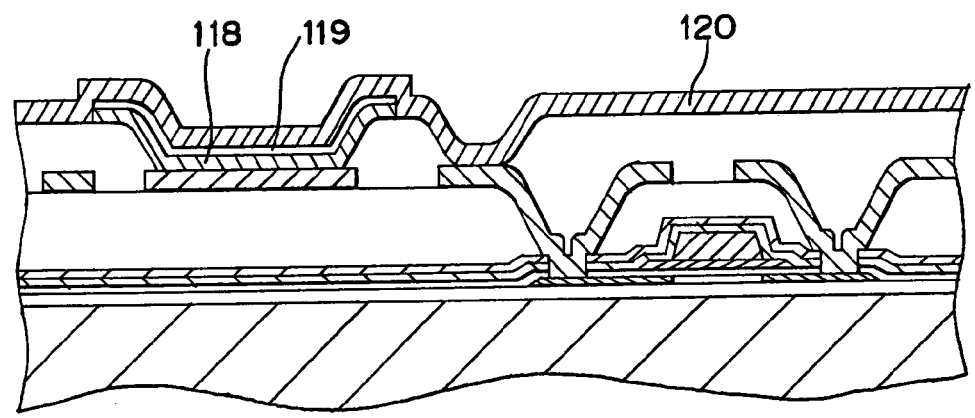

As shown in FIG. 3(C), since a layer 118 containing a luminous body is formed over the second electrode 114 and formed along the side wall portions of the sixth insulating layer 115, a continuous curved shape of this portion is suitable for relaxing an internal stress of the luminous body containing layer 118.

The luminous body containing layer 118 is a charge injection transport medium and a light emitting medium containing organic compounds or inorganic compounds. The layer 118 contains one kind or plural kinds of layers selected from the group consisting of low molecular weight organic compounds, medium molecular weight organic compounds, and high molecular weight organic compounds, which may be combined with the inorganic compounds having an electron injection transport property or a hole injection transport property. As the luminous body, phenyl anthracene derivative, tetraaryldiamine derivative, quinolinol complex derivative, distyryl benzene derivative, and the like may be applied, and with the above substances used for host substances, a coumarin derivative, DCM, quinacridone, rubrene, and the like are applied. Further, other known materials can be applied. As the high molecular weight organic compounds, there are polyparaphenylene vinylene-based, polyparaphenylene-based, polythiophene-based, and polyfluorene-based compounds. For example, poly(p-phenylene vinylene): PPV, poly(2,5-dialkoxy-1,4-phenylene vinylene): RO-PPV, poly[2-(2'-ethylhexoxy)-5-methoxy-1, 4-phenylene vinylene]: MEH-PPV, poly[2-(dialkoxyphenyl)-1,4-phenylene vinylene]: ROPh-PPV, poly[p-phenylene]: PPP, poly(2,5-dialkoxy-1,4-phenylene): RO—PPP, poly((2,5-dihexoxy-1,4-phenylene), polythiophene: PT, poly(3-alkylthiophene): PAT, poly(3-hexylthiophene): PHT, poly(3-cyclohexylthiophene): PCHT, poly(3-cyclohexyl-4-methylthiophene): PCHMT, poly(3,4-dicyclohexylthiophene): PDCHT, poly[3-(4-octylphenyl)-thiophene]: POPT, poly[3-(4-octylphenyl)-2,2-bithiophene]: PTOPT, polyfluorene: PF, poly(9,9-dialkylfluorene): PDAF, poly(9, 9-dioctylfluorene): PDOF and the like can be given. As the inorganic compound materials diamond-like carbon (DLC), Si, Ge, and oxide or nitride of the above substances, and may be appropriately doped with P, B, N, and the like can be given. Further, the inorganic compound materials include diamond like carbon (DLC), Si, Ge, and an oxide or nitride thereof, which may be doped appropriately with P, B, N, or the like. Also, there may be applied an oxide, nitride, or fluoride of alkali metal or alkali earth metal and a compound or alloy of the above metal and at least Zn, Sn, V, Ru, Sm, or In.

The above-mentioned materials are given as examples. With use of these materials, the light emitting element can be formed by appropriately laminating layers each having a function, such as a hole injection transport layer, a hole transport layer, an electron injection transport layer, an electron transport layer, a light emitting layer, an electron blocking layer, and a hole blocking layer. Also, a mixed layer or a mixed juncture made by combining each of these layers may be formed.

As a suitable combination with a color filter, an element for emitting white light is preferred. In a case where white light emission is not obtained with a single coloring matter contained in a light emitting layer, a plurality of coloring matters are used as luminescent centers, and simultaneous emission is performed among the coloring matters to thereby effect whitening due to additive color mixture. In this case, a method of laminating light emitting layers having different luminescent colors, a method of mixing plural luminescent centers in a single or plural light emitting layers, or the like can be applied. As a method of obtaining white light emission, there are a method of laminating light emitting layers that respectively emit R(red), G(green), and B(blue), which are light's three primary colors, to attain additive color mixture, and a method of utilizing a complementary color relationship of two colors. When complementary colors are used, blue and yellow, and bluish green and orange are known as a combination. In particular, the latter is thought to be advantageous from a point where light emission in a wavelength region relatively high in luminosity factor can be utilized.

In an example using a low molecular weight organic light emitting medium for the luminous body containing layer 118, a structure is such that an electron injection transport layer, a red light emitting layer, a green light emitting layer, a hole transport layer, and a blue light emitting layer are successively formed on the second electrode (cathode) 114. To be specific, the luminous body is prepared by applying 1,2,4-triazole derivative (p-EtTAZ) for the hole transport layer and setting a thickness thereof to 3 nm, whereby the hole pass rate within the p-EtTAZ layer increases. Then, a hole is injected also into tris(8-quinolinolato)aluminum ($Alq_3$) used for a green light emitting layer, thereby obtaining light emission. In this construction, bluish green light emission in which a TPD blue color is mixed with an $Alq_3$ green color is obtained as the blue light emitting layer. In order to realize a white light emission by adding a red color to the above-mentioned bluish green light emission, a red light emitting pigment may be doped into either $Alq_3$ or TPD as the red light emitting layer. As the red light emitting pigment, Nile red or the like may be applied.

Further, as another structure of the luminous body containing layer 118, an electron injection transport layer, an electron transport layer, a light emitting layer, a hole transport layer, and a hole injection transport layer are formed in the stated order from the second electrode (cathode) 114 side. For an applicable material combination in this case, there are formed a 15 nm-thick $Alq_3$ as the electron injection transport layer, and a 20 nm-thick phenyl anthracene derivative as the electron transport layer. The light emitting layer has such a structure that a 25 nm-thick first light emitting layer obtained by mixing tetraaryl benzidine derivative and phenyl anthracene derivative at a volume ratio of 1:3 with 3% by volume of styryl amine derivative contained therein and a 40 nm-thick second light emitting layer obtained by mixing tetraaryl benzidine derivative and 10,10'-bis[2-biphenylyl]-9,9'-bianthryl(phenyl anthracene derivative) at a volume ratio of 1:3, with 3% by weight of naphthacene derivative contained therein are laminated. The hole transport layer is formed of N,N,N',N'-tetrakis-(3-biphenyl-1-il) benzidine (tetraaryl benzidine derivative) having a thickness of 20 nm. The hole injection layer is formed of N,N'-diphenyl-N,N'-bis[N-phenyl-N-4-tolyl(4-aminophenyl)] benzidine with a thickness of 30 nm.

In the above-mentioned structure, an inorganic electron injection transport layer may be used as the electron injection transport layer. For the inorganic electron transport layer, n-type diamond like carbon (DLC) can be applied. To make a DLC film into n-type, the film may be doped with phosphorus or the like appropriately. Other than phosphorus, a kind of oxides selected from the group consisting of an alkali metal element, alkali earth metal element, and lanthanoide series element, and at least one kind of an inorganic material selected from the group consisting of Zn, Sn, V, Ru, Sm, and In can be applied.

An oxide conductive material layer 119 such as ITO, ZnO, or $SnO_2$ is formed with a thickness of about 10 to 30 nm on the luminous body containing layer 118. Although not shown, between the oxide conductive material layer 119 and the luminous body containing layer 118, a layer containing alkali metal or alkali earth metal with a work function of 3 eV or smaller is formed.

In addition, a third electrode 120 is formed so as to cross the second electrode 114 that extends in a strip shape, the third electrode similarly extending in a strip shape. The third electrode 120 is formed in contact with the first electrode 111 and the oxide transparent conductive material layer 119. A material having an opposite polarity to that of the second electrode 114 is selected to form the third electrode 120.

Figure 6:
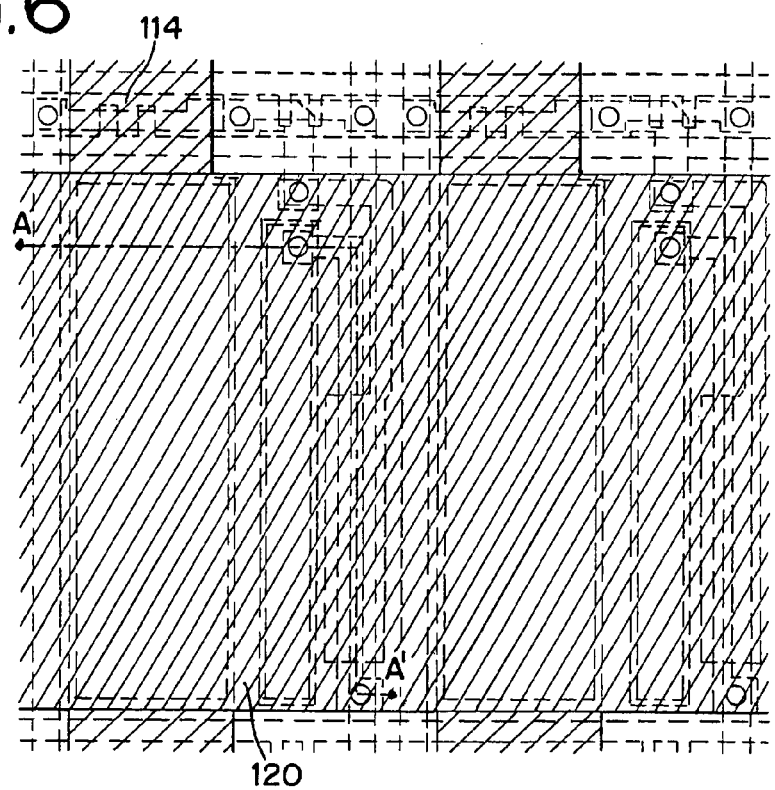
FIG. 6 is a top view useful in explaining a step of manufacturing the pixel according to Embodiment Mode 1.

FIG. 6 is a top view of this state, and a vertical section view corresponding to a line of A–A' is shown in FIG. 3(C). As is seen, it is possible to apply an electric field by the intermediation of the luminous body containing layer 118 and the oxide conductive material layer 119 at a crossing of the second electrode 114 and the third electrode 120.

Figure 19A:
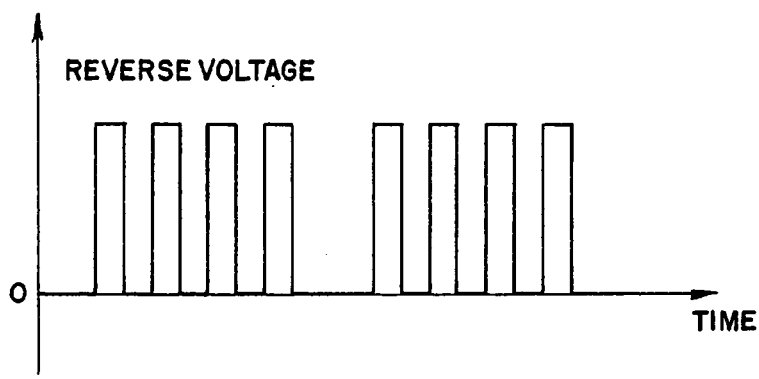
FIGS. 19(A)–19(B) are graphs that show a voltage waveform when a pulsed reverse voltage is applied in the present invention.
Figure 19B:
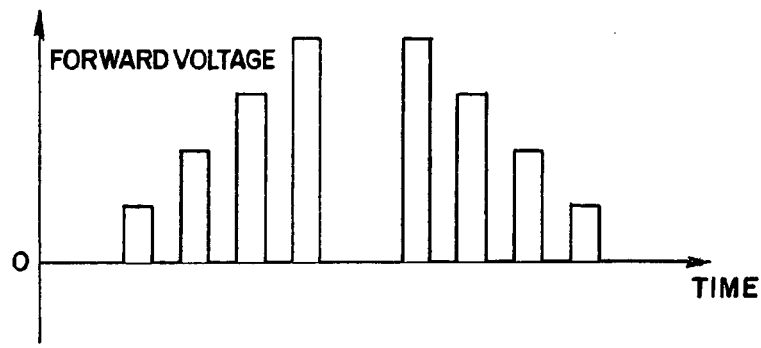

In this state, a reverse voltage can be applied. That is, a positive voltage is applied to the third electrode with respective to the polarities in which the second electrode 114 is an anode and the third electrode 120 is a cathode. In contrast, a negative voltage is applied to the third electrode with respective to the polarities in which the second electrode 114 is a cathode and the third electrode 120 is an anode. As a voltage, a DC voltage may be applied, a pulsed voltage (FIG. 19(A)) may be applied, or a pulsed voltage that rises and drops stepwise (FIG. 19(B)) may be applied.

Figure 8:
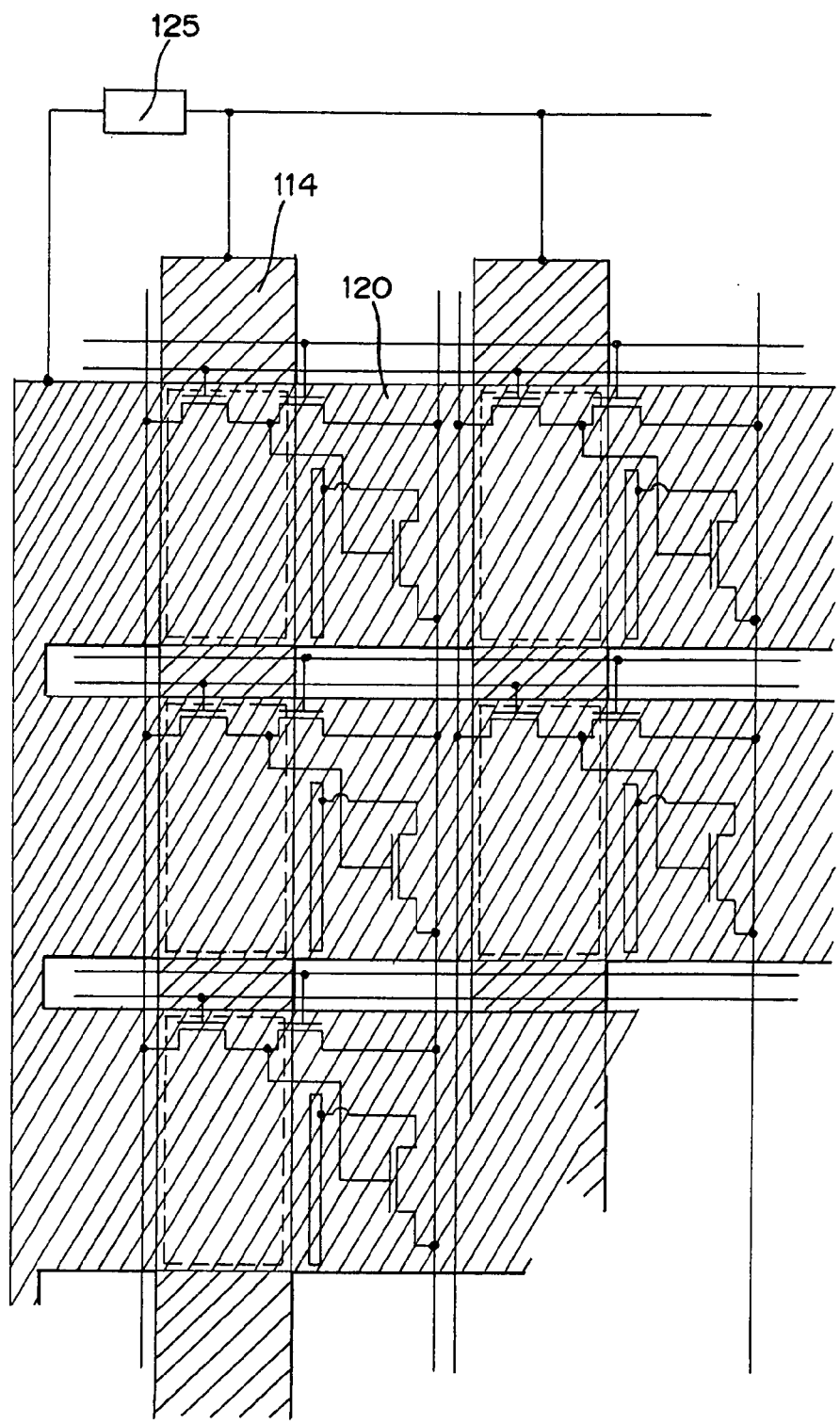
FIG. 8 is a top view that shows a state in which a reverse voltage is applied to a pixel portion according to Embodiment Mode 1.

FIG. 8 is a top view that shows a method of applying a reverse voltage in a state where a light emitting element that contains a luminous body in a single layer or in a laminate of plural layers is placed at each of pixels, and the pixels are arranged in matrix. A reverse voltage is applied between the second electrode 114 extending in a strip shape and the third electrode 120 by use of a constant voltage source 125. In this state, the third electrode 120 serves as a common electrode. A connection between the second electrode 114 and the third electrode 120, and the constant voltage source 125 may be achieved by forming a contact with a probe outside the pixel portion. A TFT is provided in a lower layer of each pixel, but the TFT does not play any role electrically in this structure.

Figure 9A:
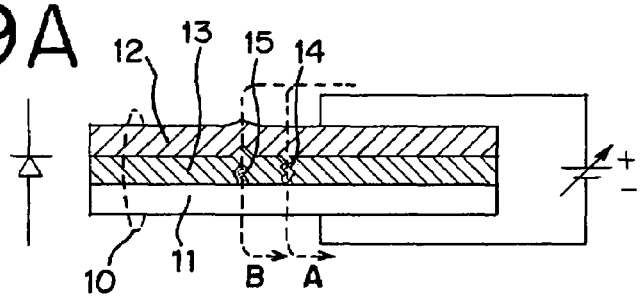
FIGS. 9(A)–9(B) are a vertical sectional view for schematically describing a defective portion repaired by application of a reverse voltage and a graph that shows a current-voltage characteristic thereof.
Figure 9B:
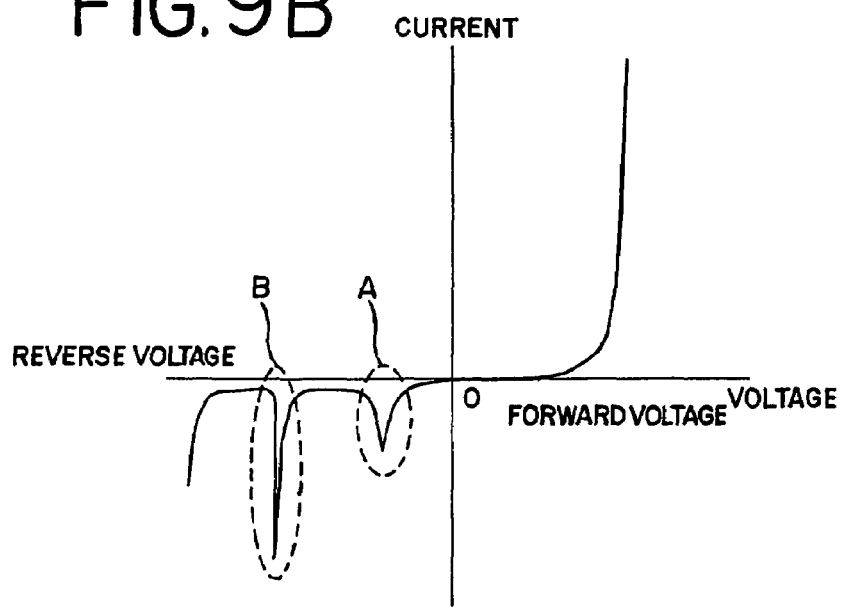
Figure 10:
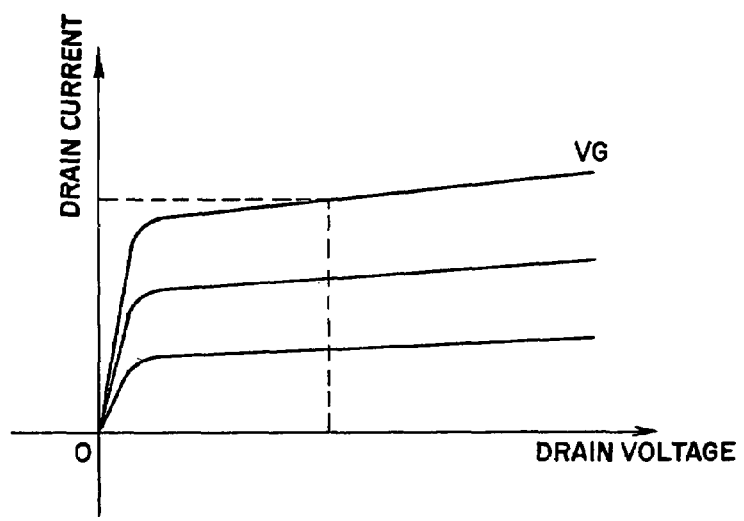
FIG. 10 is a graph that schematically shows a relationship between a drain voltage and a drain current of a TFT.

As described in FIG. 9, if a minute short-circuit portion exists, a current, which normally should not be allowed to flow concentrated on the short-circuit portion in a case of applying a reverse voltage, and the portion is changed in quality to be insulated by means of heat generation due to Joule heat. The luminous body containing layer 118 is formed mainly of organic compounds, a large part of which is formed of a material mainly containing carbon. A form of the short-circuit portion varies, but in general, it is formed in such a manner that the oxide conductive material layer 119 or the third electrode is leaked to a hole. Otherwise, a form is taken in many cases in which a foreign matter exists in the luminous body containing layer 118. In this portion, the heat generation from the reverse voltage application changes the metal material of the third electrode in quality. The oxide conductive material works effectively to supply oxygen and to oxidize and insulate the metal material.

After repairing the short-circuit portion by the reverse voltage, as shown in FIG. 1, a seventh insulating film 122 is formed on the third electrode, and further is patterned to be suitable to a shape of the individual electrode. The seventh insulating film 122 is formed of silicon nitride. The pattern is used for a mask, and a part of the third electrode not overlapping the mask is removed by etching process. As a result, it is possible to form the light emitting element 100 to be connected to a TFT 150. The light emitting element 100 is formed by laminating the second electrode 114, the luminous body containing layer 118, the oxide conductive material 119, and the third electrode 121.

Figure 7:
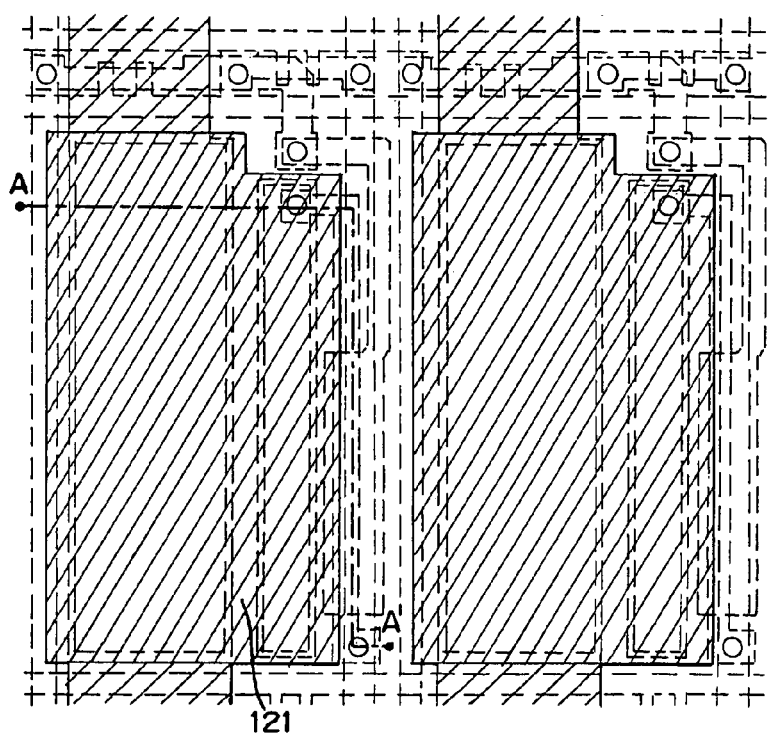
FIG. 7 is a top view that shows a structure of the pixel according to Embodiment Mode 1.

FIG. 7 is a top view of this state, and a vertical section view corresponding to a line of A–A' is shown in FIG. 1. In this way, the third electrode 121 made into the individual electrodes is formed. In addition, an eighth insulating electrode 122 covering the entirety functions as a protective film to prevent penetration of moisture or the like from outside.

With such a manufacturing method, even in a case of the pixel structure having the active matrix driving system, the reverse voltage can be applied without passing through the TFT. When a defective portion exists, the portion can be changed in quality to be insulated through instant application of a sufficient current.

It should be noted here that the present invention is not limited to the embodiment mode described above, and various modifications may be allowed without departing from the scope of the invention.

Embodiment Mode 2

In this embodiment mode, a single layer or a laminate of plural layers that contains a luminous body, and a first common electrode and a second common electrode are formed on an individual pixel electrode to be connected to a TFT, the first and second common electrodes overlapping the individual pixel electrode via the single layer or the laminate and being separated from each other, and a voltage is applied between the first common electrode and the second common electrode to repair a short-circuit defective portion.

Figure 11:
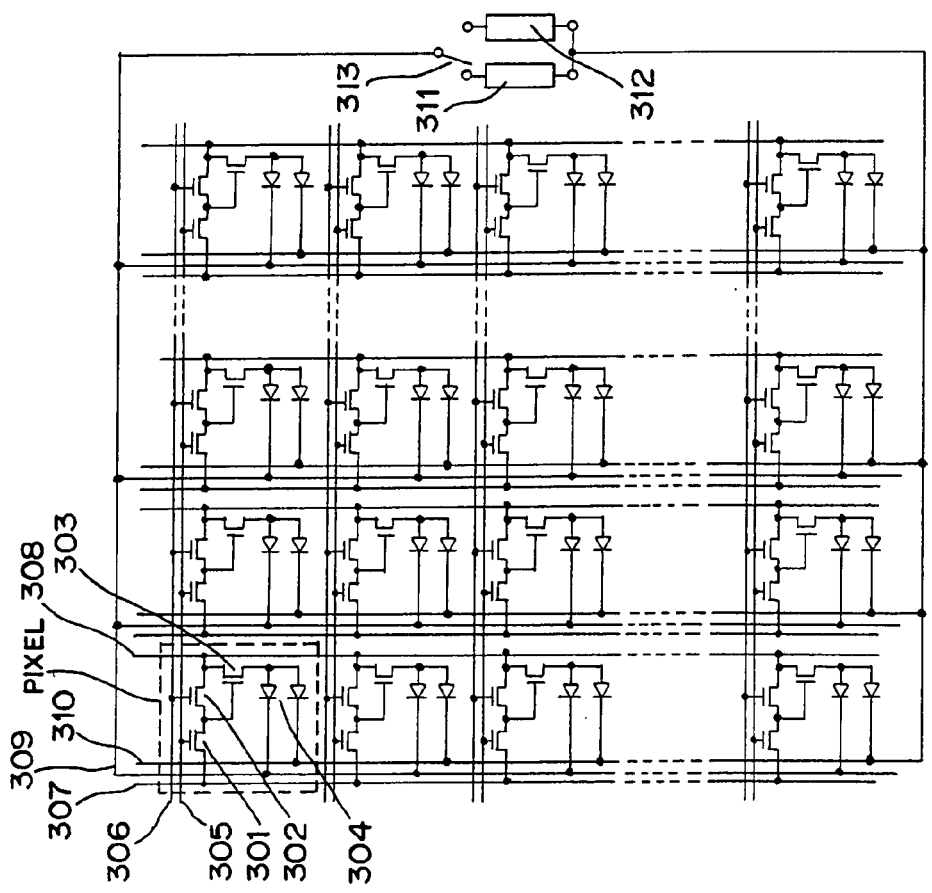
FIG. 11 is an equivalent circuit that shows a structure of a pixel portion according to Embodiment Mode 2.

FIG. 11 is an equivalent circuit diagram of a pixel portion according to this embodiment mode, and shows an example of structure including a scan signal line 305, an erase signal line 306, a data line 307, a power source line 308, a select TFT 301, a switch TFT 302, and a control TFT 303. One terminal of a light emitting element 304 is connected to the control TFT 303, and the other terminal is separately connected to a first common wiring 309 and a second common wiring 310.

A mechanism is employed in which the first common wiring 309 and the second common wiring 310 are respectively connected to constant voltage sources 311 and 312 having different polarities, and a reverse voltage is effectively applied to the light emitting element 304 by changing connection states appropriately by use of a switch 313.

Figure 12:
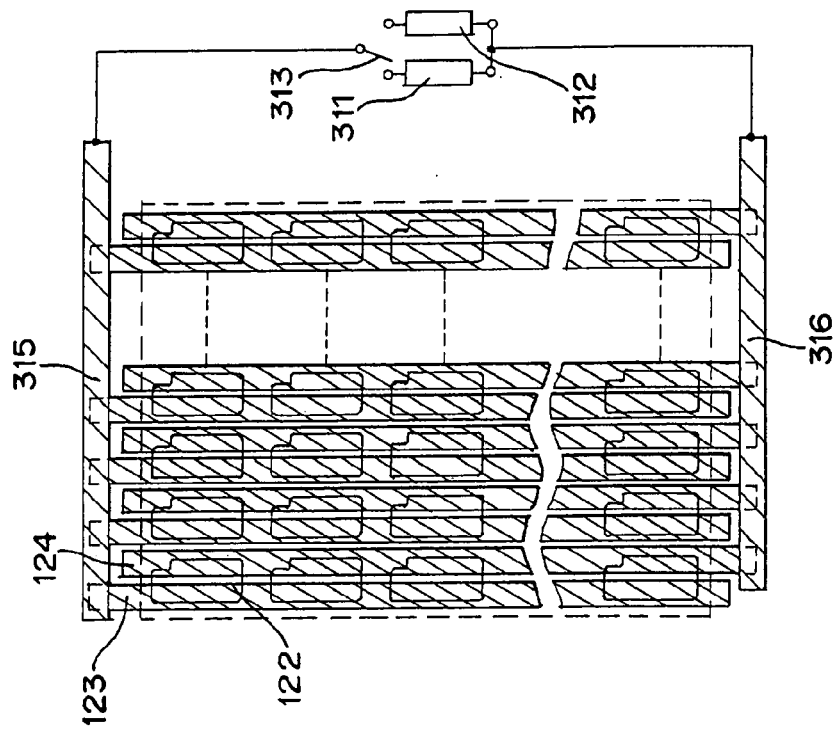
FIG. 12 is a top view that shows a structure of the pixel portion according to Embodiment Mode 2

In such a pixel structure, the first common wiring and the second common wiring are realized in such a mode as shown in FIG. 12. Outside a pixel portion, first common wirings 123 and second common wirings 124 are realized to be respectively connected by connection wirings 315 and 316 formed so as to cross the wirings, and to be connected to the constant voltage sources 311 and 312 having different polarities.

Figure 14:
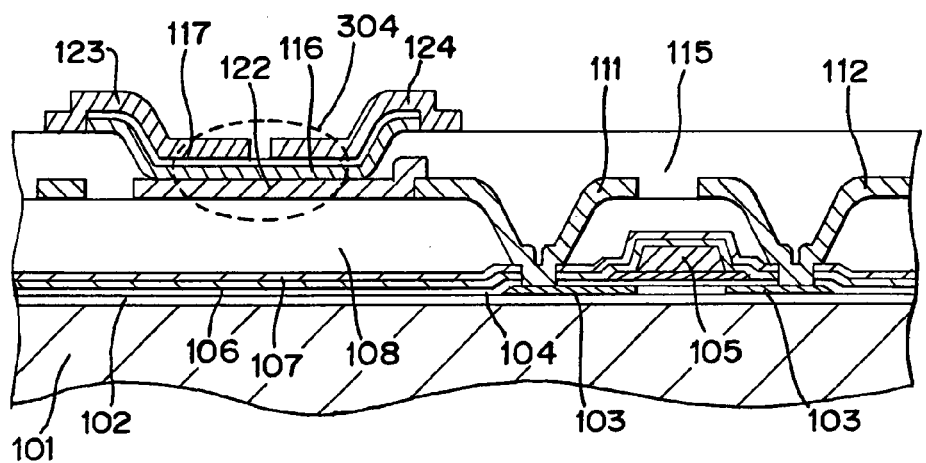
FIG. 14 is a vertical sectional view that shows a structure of a pixel according to Embodiment Mode 2
Figure 15:
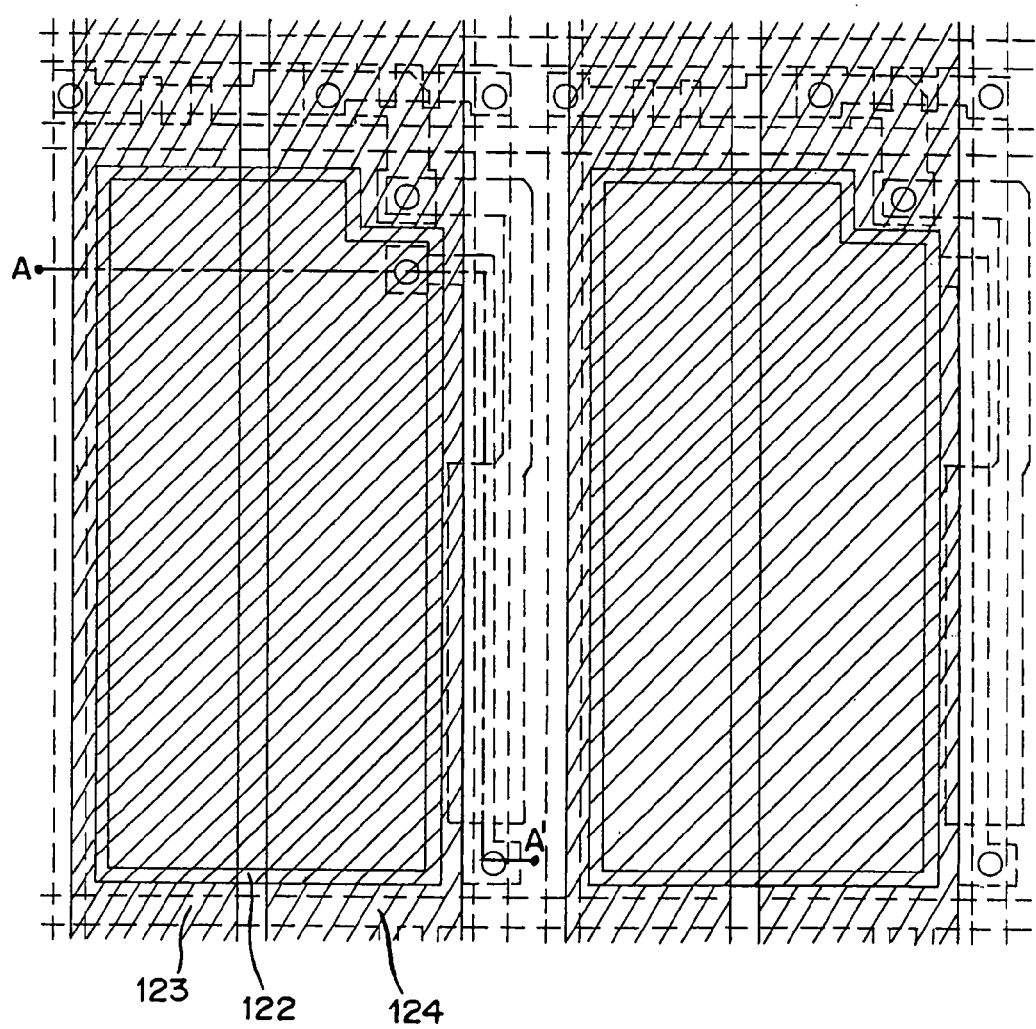
FIG. 15 is a top view that shows a structure of the pixel according to Embodiment Mode 2.

As an example of a structure of the light emitting element 304 and the control TFT 303, FIG. 14 shows its vertical sectional view. The structures of the substrate 101, the first insulating film 102, the semiconductor film 103, the second insulating film 104, the gate electrode 105, the third insulating film 106, the fourth insulating film 107, the fifth insulating film 108, the first electrode 111, the wiring (power source line) 112, and the sixth insulating film 115 are the same as those of Embodiment Mode 1. FIG. 15 is a top view of this state, and a vertical section view corresponding to a line of A–A' is shown in FIG. 14.

The light emitting element 304 is formed by laminating an individual pixel electrode 122 formed on the fifth insulating film 108, the luminous body containing layer 116, and the oxide conductive material 117, and forming on the lamination the first common electrode 123 and the second common electrode 124. The common electrodes are formed of a same material. When the electrodes are viewed as diodes, they have rectification properties in a same direction. The first common electrode 123 and the second common electrode 124 are imparted with different potentials in a case of applying a reverse voltage, and the potentials are alternated with each other, thereby repairing the light emitting element.

Figure 13A:
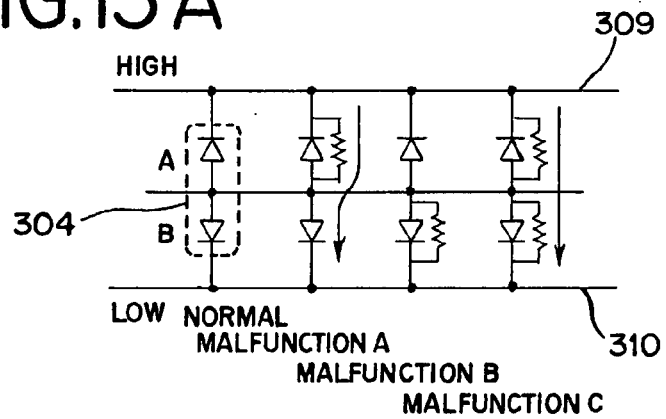

FIG. 13 is a circuit diagram useful in schematically explaining how the repairing of the light emitting element is performed in this embodiment mode. FIG. 13(A) shows a state where the first common wiring 309 is connected to a high potential, and the second common wiring 310 is connected to a low potential. A current equal to or higher than a reverse saturation current does not flow through a normal light emitting element that includes no short-circuit defect or no leak area whose defective state is close to the short-circuit. On the other hand, in a case where an element A includes a short-circuit defect, a current flows through the defective portion (malfunction A). In this case, the short-circuit defect can be repaired. However, when a short-circuit defect is in an element B (malfunction B), the defect cannot be repaired in this bias state. In a case where both the element A and the element B have short-circuit defects, it is possible to repair both of the short-circuit defects in the element A and the element B, but if the repairing of the defect in the element A is completed more quickly than that of the element B, it becomes impossible to repair the defect in the element B.

Figure 13B:
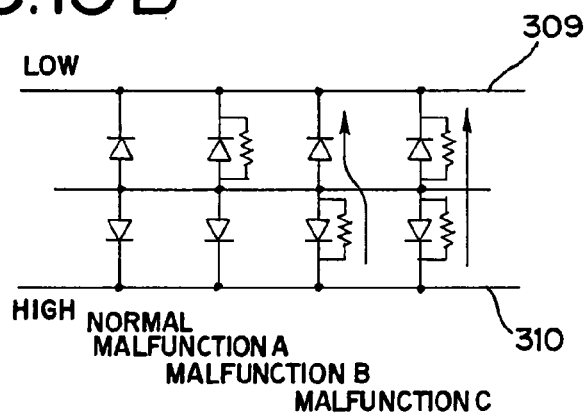

In order to repair both of the short-circuit defects in the element A and the element B, as shown in FIG. 13(B), the bias state of the first common wiring 309 and the second common wiring 310 may be reversed. For application of a reverse voltage, it is possible to employ a method of applying a pulsed voltage to repair the short-circuit defective portion. Also, the short-circuit defective portion can be repaired by applying a pulsed voltage that rises and drops stepwise.

With such a pixel structure, even when the pixel structure utilizes the active matrix driving system, the reverse voltage can be applied without passing through the TFT. Even if a defective portion exists, the portion can be changed in quality to be insulated through instant application of a sufficient current.

It should be noted here that the present invention is not limited to the embodiment mode described above, and various modifications may be allowed without departing from the scope of the invention.

Embodiment Mode 3

Figure 16:
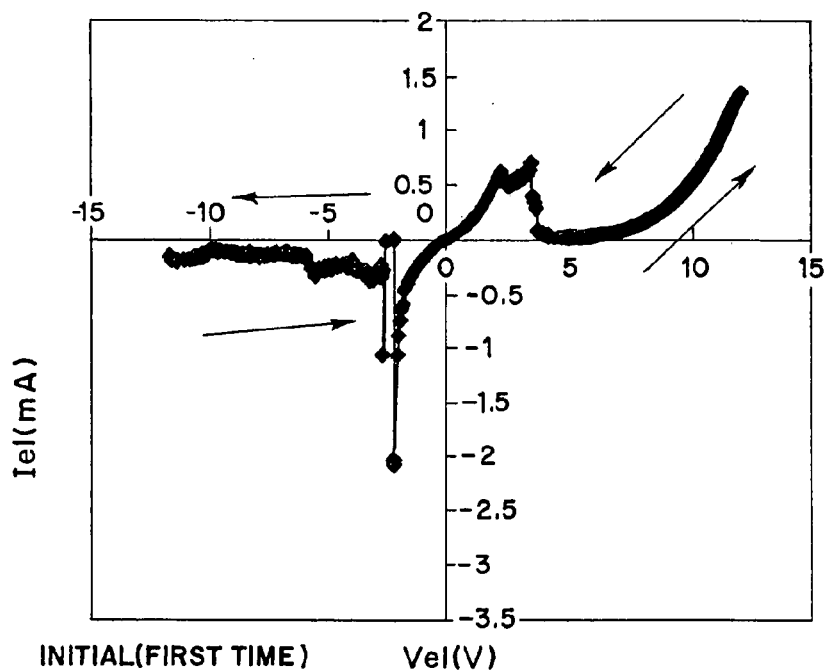
FIG. 16 is a graph that shows a current-voltage characteristic when a first voltage sweep is performed on the light emitting element.
Figure 17:
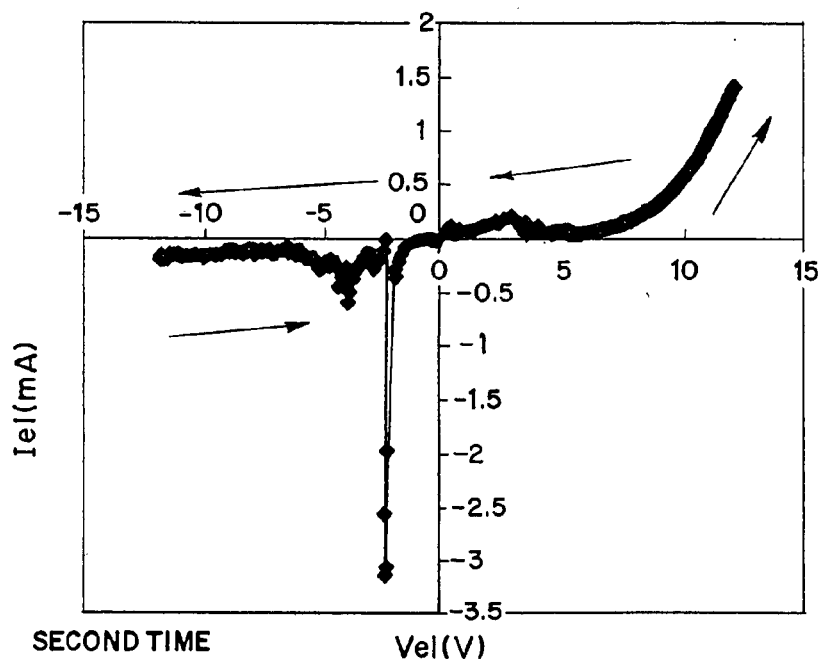
FIG. 17 is a graph that shows a current-voltage characteristic when a second voltage sweep is performed on the light emitting element.
Figure 18:
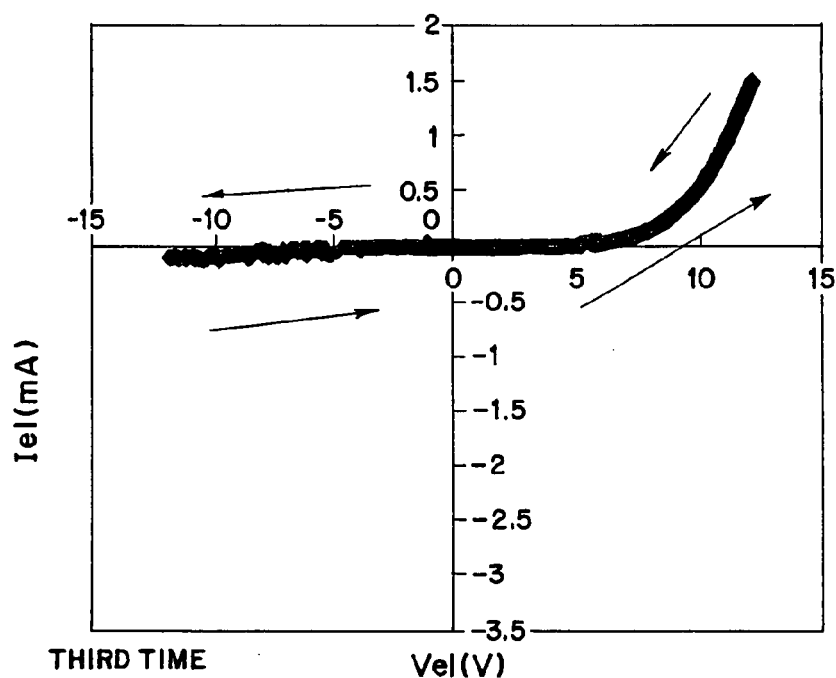
FIG. 18 is a graph that shows a current-voltage characteristic when a third voltage sweep is performed on the light emitting element.

FIGS. 16 to 18 show a practical example of repairing a light emitting element through application of a reverse voltage. The light emitting element has a structure of laminating as a layer containing a luminous body CuPc, α-NPD, $AlQ_3$ to which DCM is added as a dopant, and a non-doped $AlQ_3$ between a pair of electrodes. FIG. 16 shows a current-voltage characteristic when a voltage sweeps within ±12 V from a forward voltage to a reverse voltage. When a forward voltage is applied, a forward current abnormally increases in a region of 5 V or lower. Also, when a reverse voltage is applied, a reverse current abnormally increases in a region of 0 to −5 V. At this time, the reverse current rapidly increases temporally, but decreases to the original current value in no time. That is, a state is obtained in which the short-circuit portion is repaired. This means that a high density current locally flows to heat and insulate the portion. However, if the reaction is not sufficient, or another similar short-circuit portion exists, as shown in FIG. 17, a similar phenomenon may be observed at the time of the second voltage sweep. When the above-mentioned voltage sweep from forward to reverse or the voltage sweep in the opposite direction is repeated once or plural times, a clear current-voltage characteristic can be obtained as shown in FIG. 18.

As described above, according to the present invention, by arranging the first common electrode and the second common electrode in parallel on the single layer or the laminate of plural layers that contains the luminous body and applying a voltage between the two electrodes, the defective portion is completely repaired through the application of a reverse voltage without passing through the TFT, so that the short-circuit or leak area of the light emitting element can be repaired.

As a result, an unnecessary consumption current of the light emitting device is suppressed to control the heat generation, making it possible to reduce the degradation of the light emitting element such as increase and spread of non-light emitting points.

The invention claimed is:

1. A method of manufacturing a light emitting device comprising:

forming a thin film transistor over a substrate, wherein the thin film transistor comprises a semiconductor film and a gate electrode;

forming an insulating film over the thin film transistor;

forming a first electrode and a second electrode on the insulating film, wherein the first electrode is electrically connected to the semiconductor film;

forming a layer containing a luminous body over the second electrode;

forming a third electrode over the layer containing the luminous body, wherein the third electrode is electrically connected to the first electrode; and applying a reverse voltage between the second electrode and the third electrode.

2. A method of manufacturing a light emitting device comprising:
forming a thin film transistor over a substrate, wherein the thin film transistor comprises a semiconductor film and a gate electrode;
forming a first insulating film over the thin film transistor;
forming a first electrode and a second electrode on the first insulating film, wherein the first electrode is electrically connected to the semiconductor film;
forming a second insulating film covering a part of the first electrode and the second electrode;
forming a layer containing a luminous body over the second electrode and over the second insulting film;
forming a third electrode over the layer containing the luminous body, wherein the third electrode is electrically connected to the first electrode; and
applying a reverse voltage between the second electrode and the third electrode.

3. A method of manufacturing a light emitting device according to claim 1 or 2, wherein the first electrode and the second electrode comprise a same material.

4. A method of manufacturing a light emitting device according to claim 1 or 2, wherein a defective portion is repaired by applying a pulsed voltage.

5. A method of manufacturing a light emitting device according to claim 1 or 2, wherein a defective portion is repaired by applying a pulsed voltage that rises and drops stepwise.

6. A method of manufacturing a light emitting device comprising:
forming a thin film transistor over a substrate, wherein the thin film transistor comprises a semiconductor film and a gate electrode;
forming an insulating film over the thin film transistor;
forming a pixel electrode on the insulating film, wherein the pixel electrode is electrically connected to the semiconductor film;
forming a layer containing a luminous body over the pixel electrode;
forming a first common electrode and a second common electrode over the layer containing the luminous body, wherein the first common electrode and the second common electrode is separated with each other over the layer containing the luminous body; and
applying a reverse voltage between the first common electrode and the second common electrode.

7. A method of manufacturing a light emitting device comprising:
forming a thin film transistor over a substrate, wherein the thin film transistor comprises a semiconductor film and a gate electrode;
forming an insulating film over the thin film transistor;
forming a pixel electrode on the insulating film, wherein the pixel electrode is electrically connected to the semiconductor film;
forming a second insulating film covering a part of the pixel electrode;
forming a layer containing a luminous body over the pixel electrode and over the second insulating film;
forming a first common electrode and a second common electrode over the layer containing the luminous body, wherein the first common electrode and the second common electrode is separated with each other over the layer containing the luminous body; and
applying a reverse voltage between the first common electrode and the second common electrode.

8. A method of manufacturing a light emitting device comprising:
forming a thin film transistor over a substrate, wherein the thin film transistor comprises a semiconductor film and a gate electrode;
forming an insulating film over the thin film transistor;
forming a first electrode and a second electrode on the insulating film, wherein the first electrode is electrically connected to the semiconductor film;
forming a layer containing a luminous body over the second electrode;
forming a third electrode over the layer containing the luminous body, wherein the third electrode is electrically connected to the first electrode, and wherein the third electrode and the second electrode extend orthogonally with each other; and
applying a reverse voltage between the second electrode and the third electrode.

9. A method of manufacturing a light emitting device comprising:
forming a thin film transistor over a substrate, wherein the thin film transistor comprises a semiconductor film and a gate electrode;
forming a first insulating film over the thin film transistor;
forming a first electrode and a second electrode and over on the first insulating film, wherein the first electrode is electrically connected to the semiconductor film;
forming a second insulting film covering a part of the first electrode and the second electrode;
forming a layer containing a luminous body over the second electrode and over the second insulting film;
forming a third electrode over the layer containing the luminous body, wherein the third electrode is electrically connected to the first electrode, and wherein the third electrode and the second electrode extend orthogonally with each other; and
applying a reverse voltage between the second electrode and the third electrode.

10. A method of manufacturing a light emitting device according to claim 8 or 9, wherein the first electrode and the second electrode comprise a same material.

11. A method of manufacturing a light emitting device according to claim 8 or 9, wherein a defective portion is repaired by applying a pulsed voltage.

12. A method of manufacturing a light emitting device according to claim 8 or 9, wherein a defective portion is repaired by applying a pulsed voltage that rises and drops stepwise.

13. A method of manufacturing a light emitting device according to any one of claims 1–7, 8 and 9, wherein, a defective portion comprises a short-circuit defective portion.

14. A method of manufacturing a light emitting device according to any one of claims 1, 2, 8 and 9, further comprising forming plural fourth electrodes using the third electrode, one of the plural fourth electrodes is connected to the first electrode, after applying the voltage.

* * * * *